(12) United States Patent
Hwang

(10) Patent No.: US 8,492,812 B2
(45) Date of Patent: Jul. 23, 2013

(54) SEMICONDUCTOR DEVICE HAVING DUMMY PATTERN AND METHOD OF FABRICATING A SEMICONDUCTOR DEVICE COMPRISING DUMMY PATTERN

(75) Inventor: Kyung Ho Hwang, Yongin (KR)

(73) Assignee: Hynix Semiconductor Inc., Icheon (KR)

( * ) Notice: Subject to any disclaimer, the term of this patent is extended or adjusted under 35 U.S.C. 154(b) by 27 days.

(21) Appl. No.: 13/182,175

(22) Filed: Jul. 13, 2011

(65) Prior Publication Data

US 2012/0153369 A1    Jun. 21, 2012

(30) Foreign Application Priority Data

Dec. 17, 2010   (KR) ........................ 10-2010-0130008

(51) Int. Cl.
*H01L 27/108*   (2006.01)
*H01L 29/94*    (2006.01)

(52) U.S. Cl.
USPC .................... 257/296; 438/258; 257/E21.444

(58) Field of Classification Search
USPC .................................. 257/258, 269, 330, 296
See application file for complete search history.

(56) References Cited

U.S. PATENT DOCUMENTS 6,791,134 B2 *   9/2004   Kimura et al. ................ 257/296

FOREIGN PATENT DOCUMENTS

| JP | 2010-141107 A | 6/2010 |
|---|---|---|
| KR | 1020030002701 A | 1/2003 |
| KR | 1020060077542 A | 7/2006 |
| KR | 1020090098291 A | 9/2009 |

\* cited by examiner

*Primary Examiner* — William D Coleman

(57) ABSTRACT

A semiconductor device and a method for forming the same are disclosed. The semiconductor device includes a semiconductor substrate including a cell region and a peripheral circuit region, and an active region defined by a device isolation film, at least one dummy gate formed over the active region to expose a center part and both ends of the active region, a bit line contact plug formed between the dummy gates so as to be coupled to the center part of the active region, and a storage node contact plug that is spaced apart from the bit line contact plug by the dummy gate and is coupled to both ends of the active region. As a result, the problem that the storage node contact hole is not open in the semiconductor device can be solved, resulting in improved semiconductor device characteristics.

27 Claims, 11 Drawing Sheets

SEMICONDUCTOR DEVICE HAVING DUMMY PATTERN AND METHOD OF FABRICATING A SEMICONDUCTOR DEVICE COMPRISING DUMMY PATTERN

CROSS-REFERENCE TO RELATED APPLICATION

The priority of Korean patent application No. 10-2010-0130008 filed on 17 Dec. 2010, the disclosure of which is hereby incorporated in its entirety by reference, is claimed.

BACKGROUND OF THE INVENTION

Embodiments of the present invention relate to a semiconductor device and a method for forming the same, and more particularly to a semiconductor device including a buried gate and a method for forming the same.

Recently, most electronic appliances comprise a semiconductor device. Semiconductor devices comprise electronic elements such as transistors, resistors and capacitors. These electronic elements are designed to perform electronic functions and are integrated on a semiconductor substrate. For example, an electronic appliance, such as a computer or a digital camera, includes a memory chip for storing information and a processing chip for controlling information. The memory chip and the processing chip include electronic elements integrated on a semiconductor substrate.

Semiconductor devices must increase in integration degree in order to satisfy consumer demands for superior performance and low prices. Such an increase in the integration degree of a semiconductor device entails a reduction in a design rule, causing patterns of a semiconductor device to be increasingly reduced. Although an entire chip area increases in proportion to an increase in memory capacity as a semiconductor device becomes super miniaturized and highly integrated, a cell area, where patterns of a semiconductor device are actually formed, decreases. Accordingly, since a greater number of patterns should be formed in a limited cell area in order to achieve a desired memory capacity, there is a need for formation of microscopic (fine) patterns having a reduced minimum pattern size.

A dynamic random access memory (DRAM) device includes a plurality of unit cells each having a capacitor and a transistor. The capacitor is used to temporarily store data, and the transistor is used to transfer data between a bit line and the capacitor in response to a control signal (word line). Data transfer occurs by using the semiconductor property that electrical conductivity changes depending on the environment. A transistor has three regions, i.e., a gate, a source, and a drain. Electric charges move between the source and the drain according to a control signal input to the gate of the transistor. The movement of the electric charges between the source and the drain is achieved through a channel region, where the semiconductor property is utilized.

In a conventional method for manufacturing a transistor, a gate is formed in a semiconductor substrate, and a source and a drain are formed by doping impurities into both sides of the gate. A channel region of the transistor is formed between the source and the drain under the gate. The transistor has a horizontal channel region and occupies a predetermined area of a semiconductor substrate. Therefore, for a given transistor, the number of memory cells may determine the size of the semiconductor device.

If the total area of the semiconductor memory device is reduced, the number of semiconductor memory devices per wafer increases, thereby improving productivity. Several methods for reducing the total area of a semiconductor memory device have been proposed. One method is to replace a conventional planar gate, having a horizontal channel region, with a recess gate in which a recess is formed in a substrate and a channel region is formed along a curved surface of the recess by forming a gate in the recess. In addition, a buried gate has been studied, which can reduce parasitic capacitance of a bit line by burying the entire gate within a recess.

In a semiconductor device that has a buried gate, a bit line contact plug is coupled to an active region of the semiconductor substrate including the buried gate. A conventional method for forming a bit line contact plug will hereinafter be described in detail.

An interlayer insulation film is formed over a semiconductor substrate, including a buried gate, and the interlayer insulation film is etched to expose an active region so that a bit line contact hole is formed. A lower part of the bit line contact hole is formed to sufficiently cover the active region. Subsequently, a spacer is formed at sidewalls of a bit line contact hole, and a bit line contact plug is formed to bury the bit line contact hole. An upper part of the bit line contact plug is formed to be larger than the lower part thereof by the spacer, so that tolerance for forming a storage node contact plug in a subsequent process is reduced. As a result, the storage node contact plug is not open and thus the storage node contact plug fails to be coupled to the active region, resulting in deterioration of semiconductor device characteristics.

BRIEF SUMMARY OF THE INVENTION

Various embodiments of the present invention are directed to providing a semiconductor device and a method for forming the same that substantially obviate one or more problems due to limitations and disadvantages of the related art.

An embodiment of the present invention relates to a semiconductor device and a method for forming the same, which can solve the problems of the related art in which tolerance is reduced when a storage node contact plug of a semiconductor device having a buried gate is formed, resulting in a storage node contact plug that is not open.

In accordance with an aspect of the present invention, a semiconductor device includes a semiconductor substrate, including a cell region and a peripheral circuit region, wherein the cell region and the peripheral circuit region are each configured to include an active region defined by a device isolation film; at least one dummy gate formed over the active region of the cell region to expose a center part and first and second ends of the active region; a bit line contact plug formed between the dummy gates so as to be coupled to the center part of the active region; and a storage node contact plug that is configured to be insulated from the bit line contact plug by the dummy gate and that is coupled to any of the first and the second ends of the active region.

The dummy gate may include an insulation film.

The semiconductor device may further include a buried gate formed in the cell region.

The semiconductor device may further include a spacer formed at a sidewall of the bit line contact plug.

The semiconductor device may further include a bit line coupled to the bit line contact plug and parallel to the dummy gate.

The semiconductor device may further include an interlayer insulation film configured to insulate the bit line contact plug, the storage node contact plug, and the dummy gate from one another.

The semiconductor device may further include an operation gate formed in the peripheral circuit region of the semiconductor substrate.

A surface of the dummy gate may be formed to substantially the same level as a surface of the operation gate.

In accordance with another aspect of the present invention, a semiconductor device includes first and second active regions arranged along a first direction in a substrate; and a dummy pattern extending over from the first active region to over the second active region along a second direction at an angle with respect to the first direction, wherein the dummy pattern divides the first active region into a first source region and a first drain region and divides the second active region into a second source region and a second drain region.

The device further comprising a first bit line contact plug coupled to the first drain region and a second bit line contact plug coupled to the second drain region, wherein the first bit line contact plug and the second bit line contact plug are defined by the dummy pattern along the second direction.

The device further comprising a first storage node contact plug coupled to the first source region and a second storage node contact plug coupled to the second source region, wherein the first storage node contact plug and the second storage nod contact plug are defined by the dummy pattern along a third direction perpendicular to the second direction.

In accordance with another aspect of the present invention, a semiconductor device includes first and second active regions arranged along a first direction in a substrate; and a dummy pattern extending from a first gate region of the first active region to a second gate region of the second active region along a second direction at an angle with respect to the first direction.

In accordance with another aspect of the present invention, a method for forming a semiconductor device includes forming at least one dummy gate exposing a center part and both ends of an active region over a semiconductor substrate, including not only a cell region and a peripheral circuit region, but also the active region defined by a device isolation film; forming a bit line contact plug between the dummy gates in such a manner that the bit line contact plug is coupled to the center part of the active region; and forming a storage node contact plug that is spaced apart from the bit line contact plug by the dummy gate and is coupled to both ends of the active region.

The method may further include forming a buried gate in the semiconductor substrate of the cell region.

The method may further include forming a gate oxide film in the peripheral circuit region; forming a polysilicon layer over the gate oxide film; forming a barrier conductive layer over the polysilicon layer; and forming a gate metal layer over the barrier conductive layer.

The method may further include forming a hard mask layer, not only over the semiconductor substrate of the cell region, but also over the gate metal layer of the peripheral circuit region.

The forming of the dummy gate may include forming a mask pattern over the hard mask layer; and etching the hard mask layer of the cell region using the mask pattern as an etch mask in such a manner that the center part and both ends of the active region are exposed.

The method may further include, simultaneously with the formation of the dummy gate, forming an operation gate by etching the hard mask layer, the polysilicon layer, the barrier conductive layer, and the gate metal layer of the peripheral circuit region using the mask pattern as an etch mask.

The method may further include forming a spacer insulation film at sidewalls of the semiconductor substrate of the cell region and the operation gate of the peripheral circuit region.

The method may further include forming an interlayer insulation film over the cell region and the peripheral circuit region so as to be disposed between the dummy gate and the operation gate.

The forming of the bit line contact plug may include forming a mask pattern defining a bit line contact hole over the interlayer insulation film; forming a bit line contact hole by etching the interlayer insulation film using the mask pattern as an etch mask so as to expose the center part of the active region; and forming a conductive layer to bury the bit line contact hole.

The forming of the bit line contact hole may include etching the interlayer insulation film using an etch selection ratio related to the dummy gate.

The method may further include forming a spacer in the bit line contact hole.

The forming of the storage node contact plug may include forming a mask pattern defining a storage node contact hole over the interlayer insulation film; forming a storage node contact hole by etching the interlayer insulation film using the mask pattern as an etch mask so as to expose both ends of the active region; and forming a conductive layer to bury the storage node contact hole.

The forming of the storage node contact hole may include using a self-alignment scheme related to the dummy gate.

The method may further include forming a bit line that is coupled to the bit line contact plug and that is parallel to the dummy gate.

In accordance with another aspect of the present invention, a method for forming a semiconductor device includes forming first and second active regions arranged along a first direction in a substrate; forming a dummy pattern extending from over the first active region to over the second active region along a second direction at an angle with respect to the first direction, wherein the dummy pattern divides the first active region into a first source region and a first drain region and further divides the second active region into a second source region and a second drain region; forming an insulation layer over the substrate including the first and the second active regions; forming a first mask pattern defining the first and the second drain regions over the insulation layer; patterning the insulation layer using the first mask pattern and the dummy pattern; forming a second mask pattern defining the first and the second source regions over the insulation layer; and patterning the insulation layer using the second mask pattern and the dummy pattern.

It is to be understood that both the foregoing general description and the following detailed description of the present invention are exemplary and explanatory and are intended to provide further explanation of the invention as claimed.

BRIEF DESCRIPTION OF THE DRAWINGS

In FIG. 1, FIG. 1(*i*) is a cross-sectional view illustrating a cell region, FIG. 1(*ii*) is a cross-sectional view illustrating a peripheral circuit region, and FIG. 1(*iii*) is a plan view illustrating a cell region.

FIGS. 2A to 2L illustrate a method for forming a semiconductor device according to an embodiment of the present invention. In FIGS. 2A to 2L, (i) is a cross-sectional view illustrating a cell region, (ii) is a cross-sectional view illustrating a peripheral circuit region, and (iii) is a plan view illustrating a cell region.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
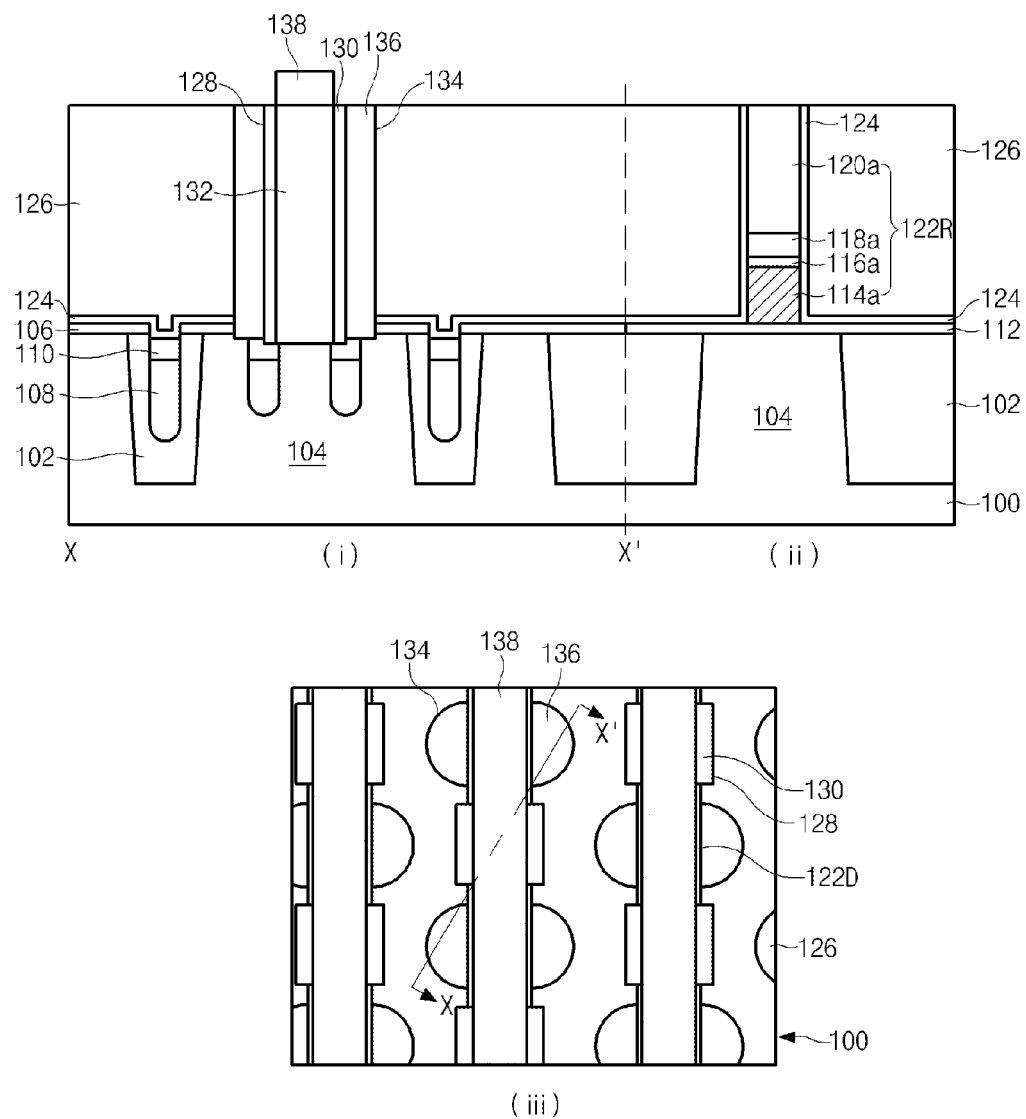
FIG. 1 illustrates a semiconductor device according to an embodiment of the present invention.

FIG. 1 illustrates a semiconductor device according to an embodiment of the present invention. In FIG. 1, FIG. 1(i) is a cross-sectional view illustrating a cell region, FIG. 1(ii) is a cross-sectional view illustrating a peripheral circuit region, and FIG. 1(iii) is a plan view illustrating a cell region.

Referring to FIG. 1, the semiconductor device according to the present invention includes a cell region (i) and a peripheral circuit region (ii). The semiconductor device includes a semiconductor substrate 100 including an active region 104 defined by a device isolation film 102; an island-type dummy gate 122D in the cell region (i) that exposes a center portion and both ends of the active region 104; an operation gate 122R in the peripheral circuit region (ii); a bit line contact plug 132 formed between the dummy gates 122D and coupled to the active region 104; and a storage node contact plug 134 insulated from the bit line contact plug 132 by the dummy gate 122D and coupled to the active region 104.

In addition, the semiconductor device may further include a buried gate 108 and a sealing insulation film 110 in the cell region (i). The semiconductor device may further include a bit line 138 that is coupled to the bit line contact plug 132 and that is parallel to the dummy gate 122D. The semiconductor device may further include an interlayer insulation film 126, which insulates a bit line contact plug 132, a storage node contact plug 134, and a dummy gate 122D from one another.

Preferably, the semiconductor device may further include an operation gate 122R over the semiconductor substrate 100 of the peripheral circuit region (ii). A surface of the operation gate 122R may be formed to the same level as the dummy gate 122D. In an embodiment, the dummy gate 122D is formed of an insulating material to prevent the occurrence of short-circuiting between the bit line contact plug 132 and the storage node contact plug 134.

As described above, a storage node contact plug 134 of the semiconductor device according to the present invention is insulated from the dummy gate 122D formed in the cell region. As a result, the tolerance for forming a storage node contact plug region is increased and a Self Align Contact (SAC) failure can be prevented.

FIGS. 2A to 2L illustrate a method for forming a semiconductor device according to an embodiment of the present invention. In FIGS. 2A to 2L, (i) is a cross-sectional view illustrating a cell region, (ii) is a cross-sectional view illustrating a peripheral circuit region, and (iii) is a plan view illustrating a cell region.

Figure 2A:
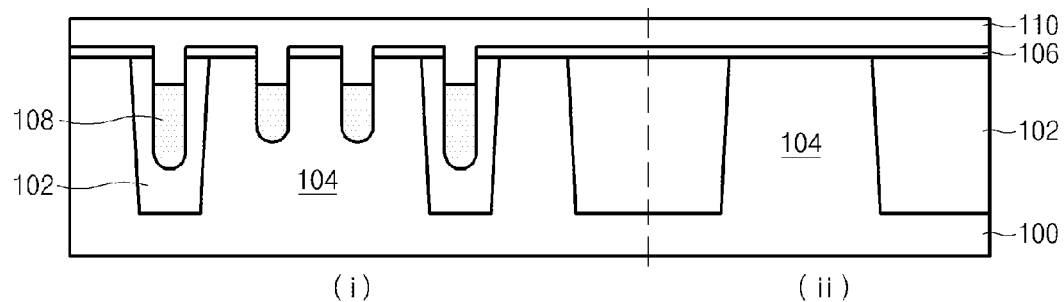

Referring to FIG. 2A, the semiconductor device according to the present invention includes a cell region (i) and a peripheral circuit region (ii). A hard mask pattern 106 for defining a trench of the cell region (i) is formed over a semiconductor substrate 100, including an active region 104 defined by a device isolation film 102. In an embodiment, the trench is formed only in the cell region (i), and it is preferable that the peripheral circuit region (ii) be wholly covered by the hard mask pattern 106.

Subsequently, the device isolation film 102 and the active region 104 of the cell region (i) are etched using the hard mask pattern 106 as a mask, thereby forming a trench. In addition, an electrode layer is formed in a lower part of the trench so that a buried gate 108 is formed. Thereafter, a sealing insulation film 110 is formed over the hard mask pattern 106 and the buried gate 108. In an embodiment, the sealing insulation film 110 may include a nitride film.

Figure 2B:
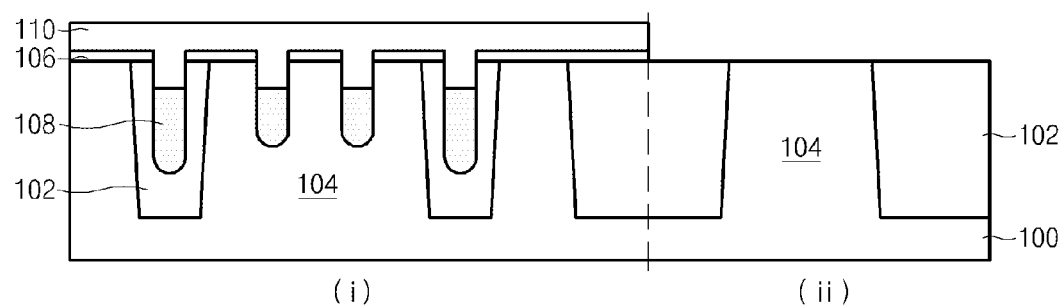

Referring to FIG. 2B, a mask (not shown) configured to open the peripheral circuit region (ii) is formed over the cell region (i). The sealing insulation film 110 and the hard mask pattern 106 formed in the peripheral circuit region (ii) are etched using the mask so as to expose the semiconductor substrate 100 of the peripheral circuit region (ii).

Figure 2C:
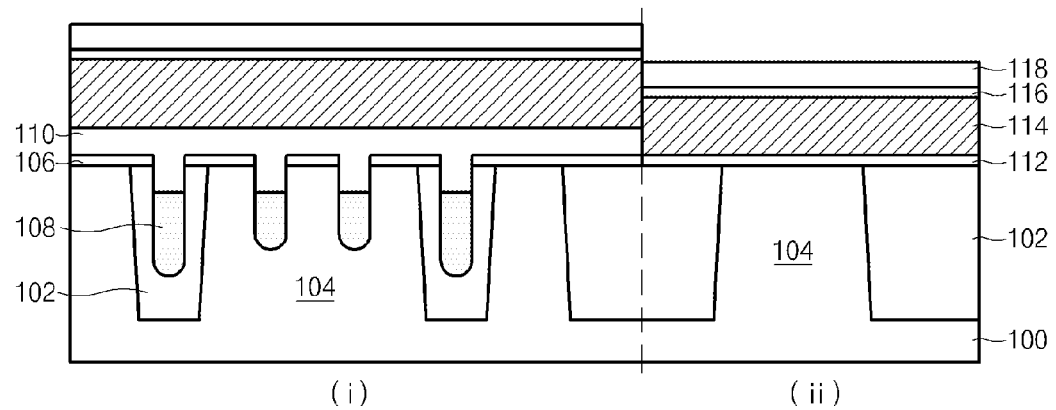

Referring to FIG. 2C, the semiconductor substrate 100 of the peripheral circuit region (ii) is oxidized to form a gate oxide film 112. Subsequently, a polysilicon layer 114, a barrier conductive layer 116, and a gate electrode layer 118 are sequentially formed not only over the sealing insulation film 110 of the cell region (i), but also over the gate oxide film 112 of the peripheral circuit region (ii). In an embodiment, the barrier conductive layer 116 may include a titanium (Ti) or titanium nitride (TiN) layer, and the gate electrode layer 118 may include tungsten (W).

Figure 2D:
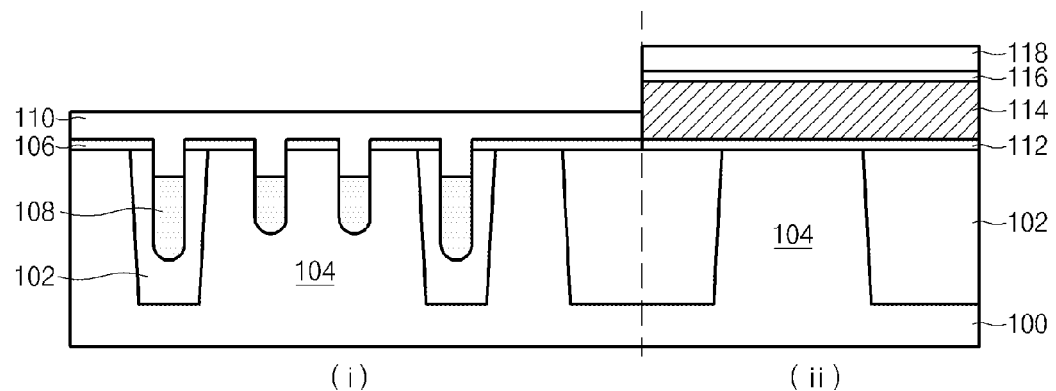

Referring to FIG. 2D, a mask (not shown) opening the cell region (i) is formed over the peripheral circuit region (ii), and the gate electrode layer 118, the barrier conductive layer 116, and the polysilicon layer 114 are etched using the mask so as to expose the sealing insulation film 110 of the cell region (i).

In an embodiment, the above-mentioned etching of the gate electrode layer 118, the barrier conductive layer 116, and the polysilicon layer 114 using the mask to open the cell region (i) may prevent an unintended bit line from being formed. A more detailed description of the unintended bit line will be described later with reference to FIG. 2F.

Figure 2E:
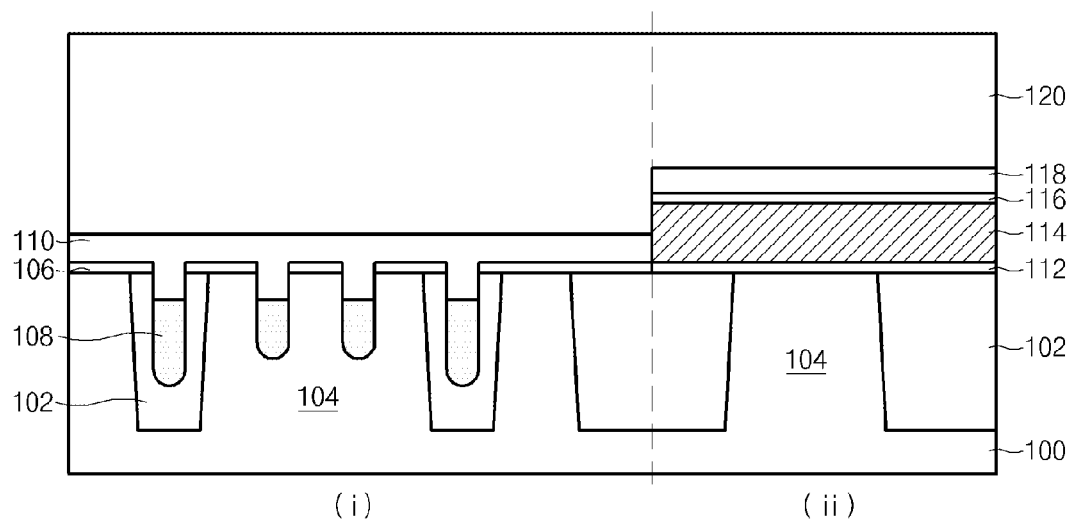

Referring to FIG. 2E, a hard mask layer 120 is formed not only over the sealing insulation film 110 of the cell region (i), but also over the gate electrode layer 118 of the peripheral circuit region (ii). Thereafter, it is preferable that a planarization etch process be performed on the hard mask layer 120. In an embodiment, the hard mask layer 120 may include a nitride film.

Figure 2F:
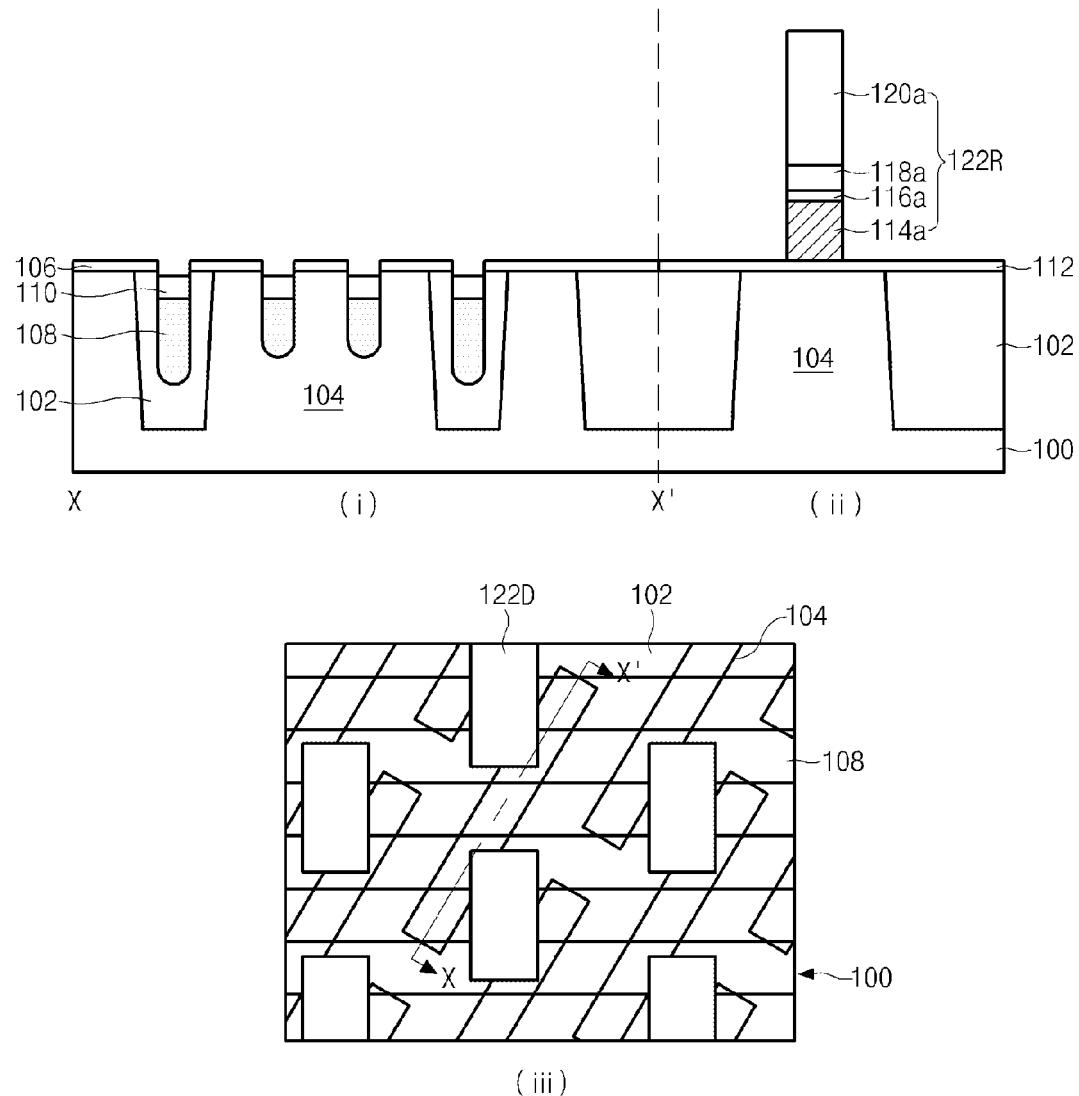

Referring to FIG. 2F, a photoresist pattern (not shown) defining a dummy gate is formed over the hard mask layer 120 of the cell region (i) and the peripheral circuit region (ii). The hard mask layer 120 of the cell region (i) is etched using the photoresist pattern (not shown) as a mask so that a dummy gate (not shown) may be formed. Preferably, the sealing insulation film 110 formed over the hard mask pattern 106 of the semiconductor substrate 100 may be etched so that it remains only over the surface of the buried gate 108. Simultaneously, the hard mask layer 120, the gate electrode layer 118, the barrier conductive layer 116, and the polysilicon layer 114 in the peripheral circuit region (ii) may be etched using the photoresist pattern (not shown) as a mask, so that an operation gate 122R formed of a laminated structure of the polysilicon pattern 114a, the barrier metal pattern 116a, the gate electrode pattern 118a, and the hard mask pattern 120a may be formed in the peripheral circuit region (ii).

The dummy gate (not shown) will hereinafter be described with reference to FIG. 2F(iii). Referring to FIG. 2F(iii), the dummy gate 122D may be formed in an island-type structure exposing a center portion of the active region 104. In this way, the formation of the island-type dummy gate 122D is used to guarantee a bit line contact plug is coupled to the center part of the active region 104 in a subsequent process. In addition, the dummy gate 122D serves as a barrier when a storage node contact hole is formed in a subsequent process, and thus the storage node contact hole can be easily formed using a self-alignment scheme. A detailed description thereof will be described later with reference to FIG. 2K.

Figure 2G:
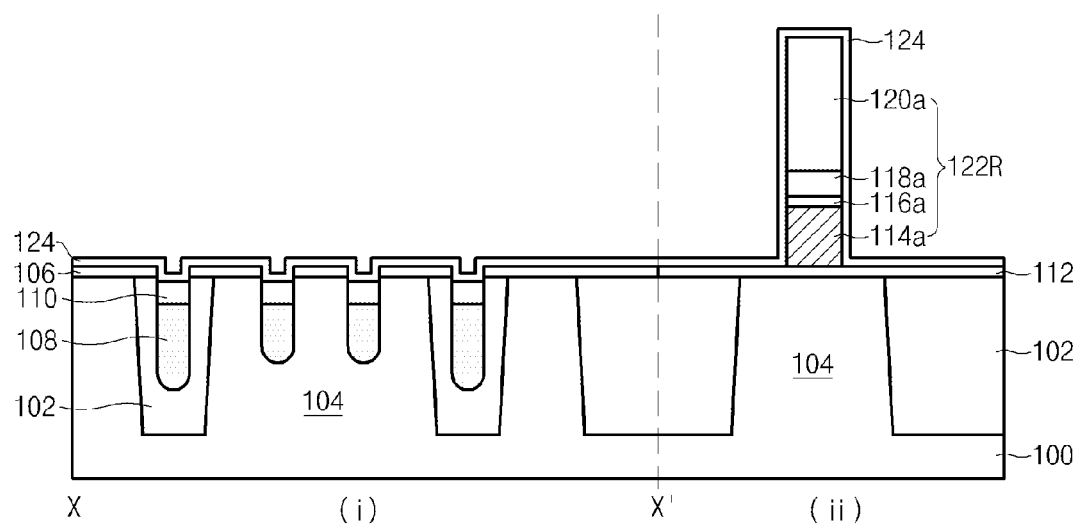

Referring to FIG. 2G, a spacer insulation film 124 is formed over the hard mask pattern 106 and the sealing insulation film 110 in the cell region (i), and also over the gate oxide film 112 and the operation gate 122R in the peripheral circuit region (ii). In an embodiment, the spacer insulation film 124 may include a nitride film.

Figure 2H:
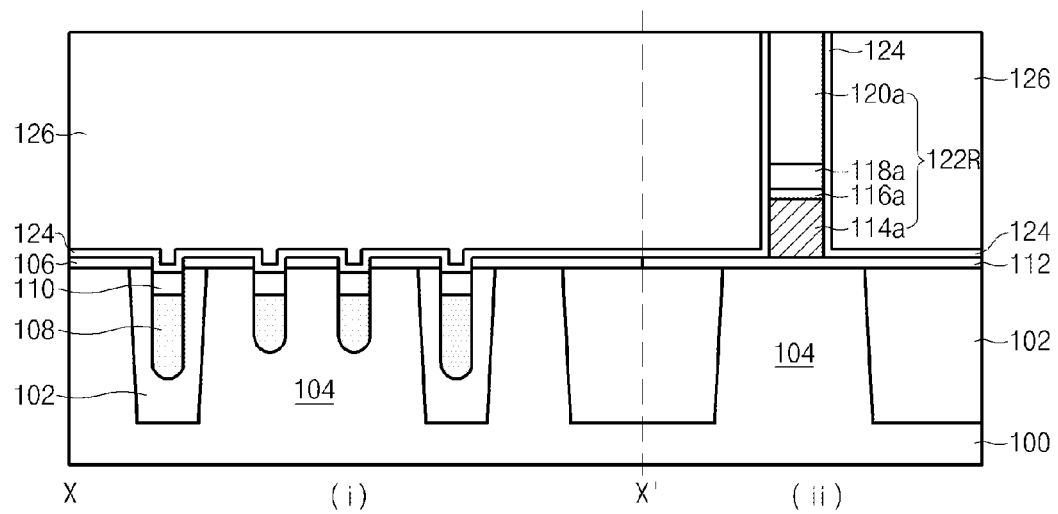

Referring to FIG. 2H, an interlayer insulation film 126 may be formed not only over the dummy gate 122D of the cell region (i) including the spacer insulation film 124, but also over the operation gate 122R of the peripheral circuit region (ii) including the spacer insulation film 124. A planarization etch process may then be performed to expose hard mask pattern 120a. In an embodiment, the interlayer insulation film 126 may include Boron Phosphorus Silicate Glass (BPSG). An annealing process may be performed after the formation of the interlayer insulation film 126.

Figure 2I:
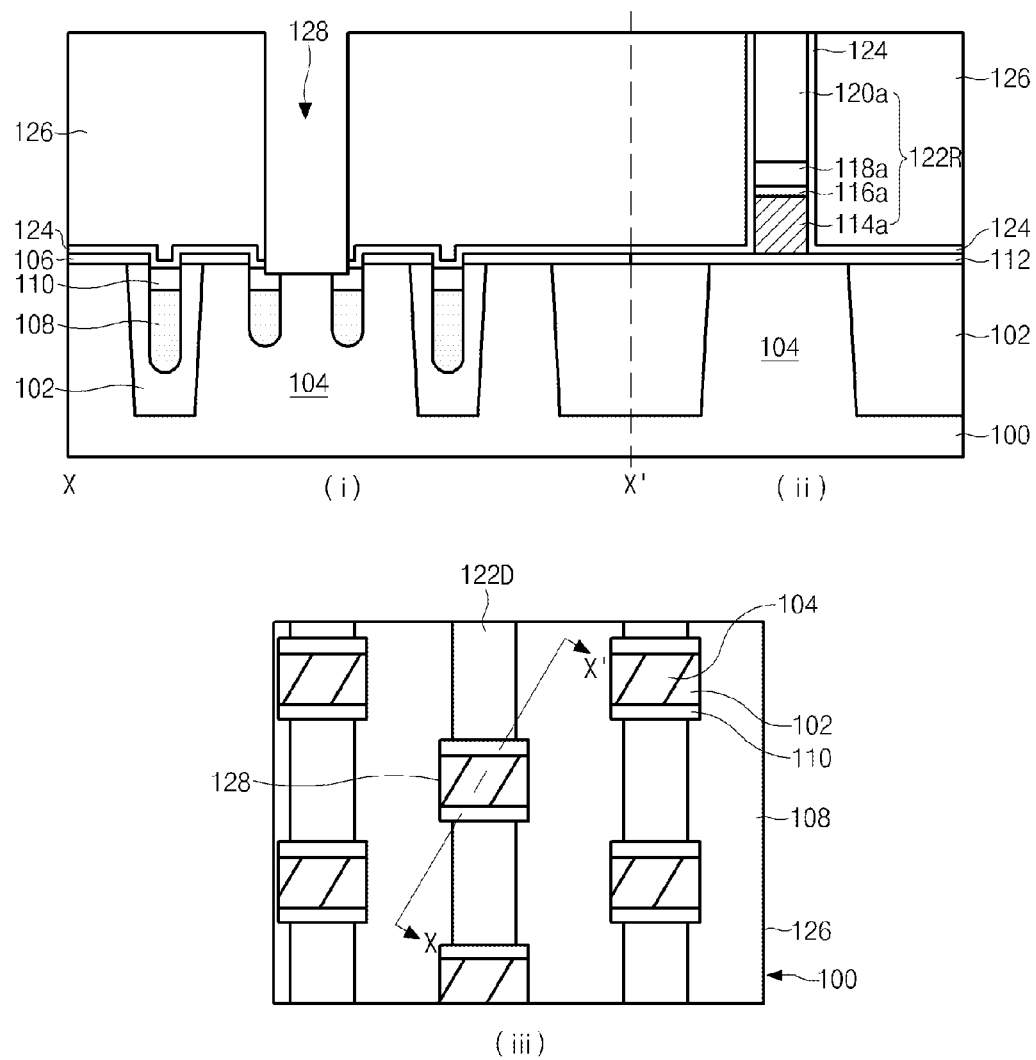

Referring to FIG. 2I, a photoresist pattern (not shown) defining a bit line contact hole is formed over the interlayer insulation film 126. The interlayer insulation film 126 is etched to expose the active region 104 using the photoresist pattern and the dummy gate 122D as a mask, such that the bit line contact hole 128 is formed. In an embodiment, the bit line contact hole 128 may be formed by etching the interlayer insulation film 126 using an etch selection ratio between the interlayer insulation film 126 and the dummy gate 122D. In other words, as shown in FIG. 2I(iii), the bit line contact hole 128 is formed to expose the center part of the active region 104. The bit line contact hole 128 is formed using an etch selection ratio between the interlayer insulation film 126 and the dummy gate 122D, thus preventing the dummy gate 122D from being damaged or lost. Accordingly, it is preferable that the bit line contact hole 128 be formed between two dummy gates 122D.

Figure 2J:
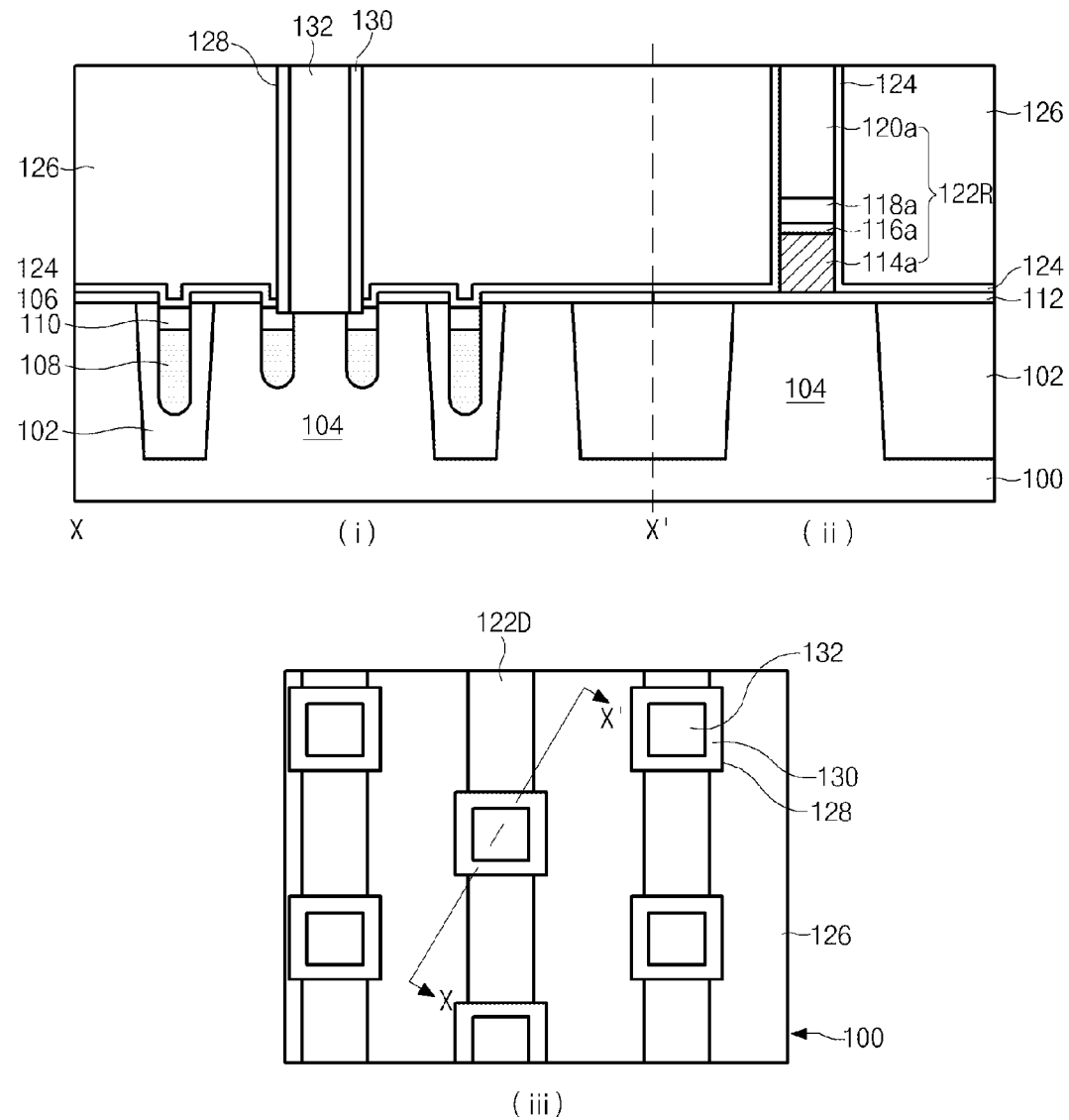

Referring to FIG. 23, a spacer insulation film is formed over the bit line contact hole 128 and is then etched back, so that a spacer 130 is formed at sidewalls of the bit line contact hole 128. Subsequently, a conductive layer is formed to bury the bit line contact hole 128, and a planarization etch process is performed on the conductive layer to expose the interlayer insulation film 126, thereby forming the bit line contact plug 132. Referring to FIG. 2J(iii), the bit line contact plug 132 may be coupled to the active region 104 between the dummy gates 122D.

Figure 2K:
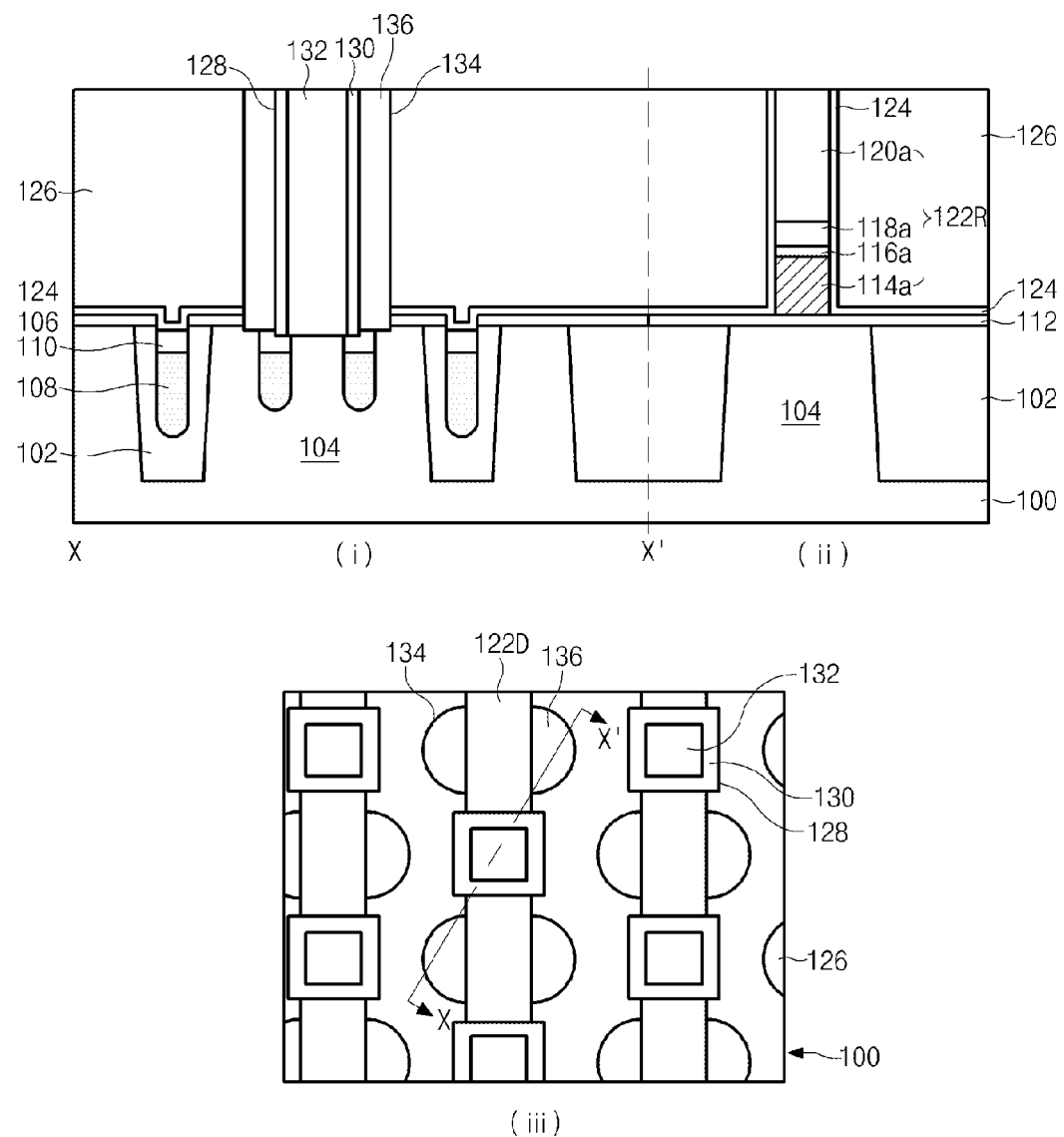
Figure 2I:
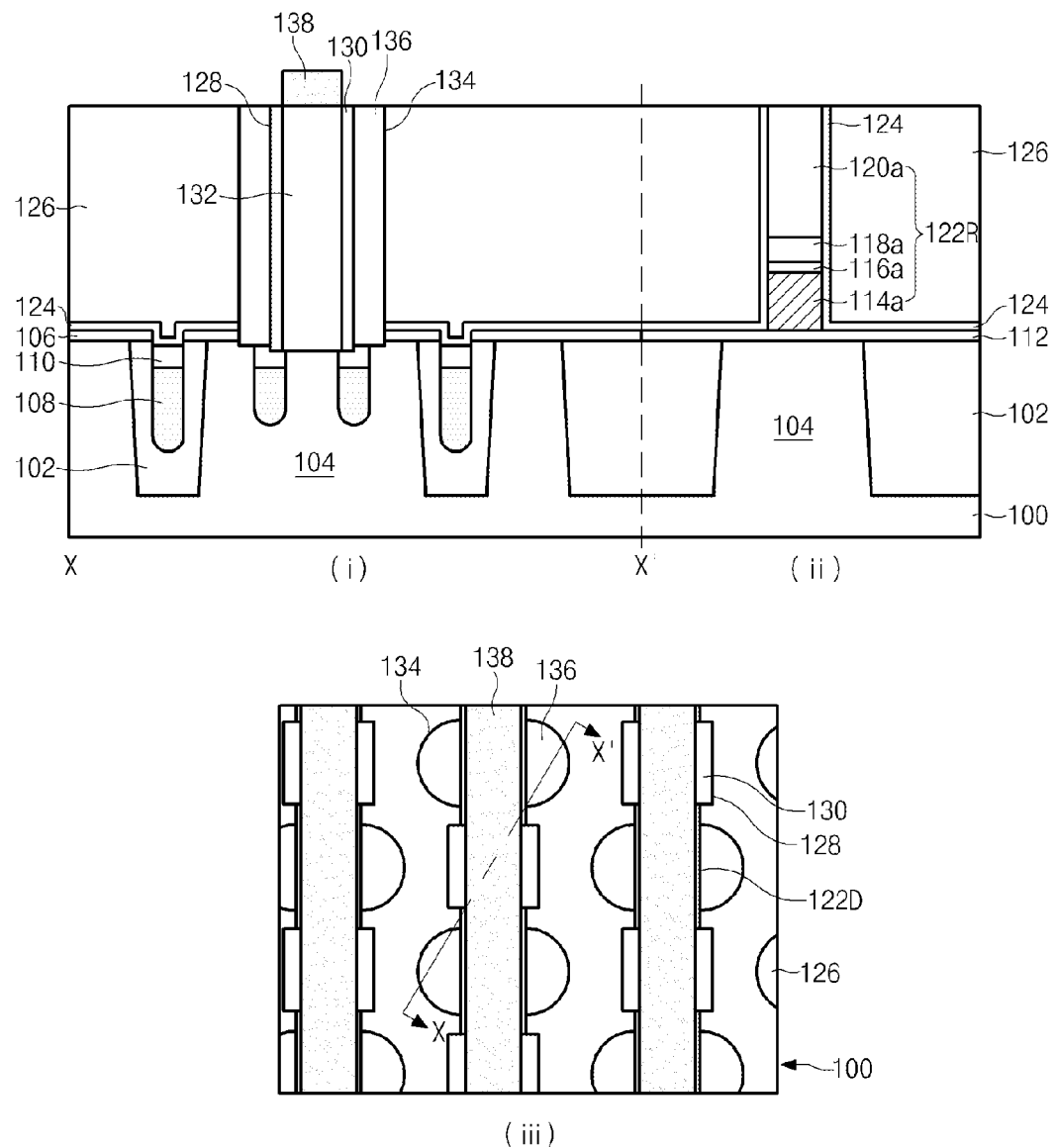

Referring to FIG. 2K, a photoresist pattern (not shown) defining a storage node contact hole is formed over the interlayer insulation film 126. The interlayer insulation film 126 is etched using the photoresist pattern and the dummy gate 122D as a mask to expose the active region 104, so that a storage node contact hole 134 is formed. Preferably, the storage node contact hole 134 may be formed according to a self-alignment process by using the dummy gate 122D as a mask. That is, the storage node contact hole 134 is formed by etching the interlayer insulation film 126 using the photoresist pattern (not shown) and the dummy gate 122D as an etch mask, so that misalignment of the storage node contact hole 134 is prevented. Furthermore, the dummy gate 122D is formed of an insulation film, so that an electrical short circuit between the storage node contact plug and the bit line contact plug can be prevented.

Subsequently, a conductive layer is formed to fill the storage node contact hole 134, and a planarization etch process is performed on the conductive layer to expose the interlayer insulation film 126 in such a manner that the storage node contact plug 136 is formed. Referring to FIG. 2K(iii), an electrical short circuit between the storage node contact plug 136 and the bit line contact plug 132 can be prevented by the dummy gate 122D.

Referring to FIG. 2L, a bit line electrode layer and a hard mask layer (not shown) are formed over the interlayer insulation film 126 including the bit line contact plug 132 (See FIG. 2K). Thereafter, a photoresist pattern (not shown) is formed over the hard mask layer (not shown). Preferably, the bit line electrode layer is etched using the photoresist pattern as a mask to form the bit line 138. Referring to FIG. 2L(iii), the bit line 138 may be coupled to the bit line contact plug 132 (See FIG. 2K), and extends parallel to the dummy gate 122D.

As is apparent from the above description, in a semiconductor device according to an embodiment of the present invention, the storage node contact plug is formed by a self-alignment etching method using a dummy gate formed in a cell region as a mask. Thus, possible misalignment can be prevented. In addition, the dummy gate serves as an insulation pattern so that an electrical short circuit between the storage node contact plug and the bit line contact plug can be prevented.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device comprising:
   a semiconductor substrate including a cell region and a peripheral circuit region, wherein the cell region and the peripheral circuit region are each configured to include an active region defined by a device isolation film;
   at least one dummy gate formed over the active region of the cell region to expose a center part and first and second ends of the active region;
   a bit line contact plug formed between the dummy gates so as to be coupled to the center part of the active region; and
   a storage node contact plug that is configured to be insulated from the bit line contact plug by the dummy gate and that is coupled to any of the first and the second ends of the active region.

2. The semiconductor device according to claim 1, wherein the dummy gate includes an insulation film.

3. The semiconductor device according to claim 1, the device further comprising a buried gate formed in the cell region.

4. The semiconductor device according to claim 1, the device further comprising a spacer formed at a sidewall of the bit line contact plug.

5. The semiconductor device according to claim 1, the device further comprising a bit line coupled to the bit line contact plug and parallel to the dummy gate.

6. The semiconductor device according to claim 1, the device further comprising an interlayer insulation film configured to insulate the bit line contact plug, the storage node contact plug, and the dummy gate from one another.

7. The semiconductor device according to claim 1, the device further comprising an operation gate formed in the peripheral circuit region of the semiconductor substrate.

8. The semiconductor device according to claim 7, wherein a surface of the dummy gate is formed at substantially the same level as a surface of the operation gate.

9. A semiconductor device comprising:
  first and second active regions arranged along a first direction in a substrate of a cell region; and
  a dummy pattern extending over from the first active region of the cell region to over the second active region of the cell region along a second direction at an angle with respect to the first direction to expose a center part and first and second ends of the first and the second active regions,
  wherein the dummy pattern divides the first active region into a first source region and a first drain region and divides the second active region into a second source region and a second drain region.

10. The semiconductor device of claim 9, the device further comprising a first bit line contact plug coupled to the first drain region and a second bit line contact plug coupled to the second drain region,
  wherein the first bit line contact plug and the second bit line contact plug are defined by the dummy pattern along the second direction.

11. The semiconductor device of claim 9, the device further comprising a first storage node contact plug coupled to the first source region and a second storage node contact plug coupled to the second source region,
  wherein the first storage node contact plug and the second storage nod contact plug are defined by the dummy pattern along a third direction perpendicular to the second direction.

12. A semiconductor device comprising:
  first and second active regions arranged along a first direction in a substrate of the cell region; and
  a dummy pattern extending from a first gate region of the first active region to a second gate region of the second active region along a second direction at an angle with respect to the first direction to expose a center part and first and second ends of the first and the second active regions.

13. A method for forming a semiconductor device comprising:
  forming at least one dummy gate over a semiconductor substrate including a cell region and a peripheral circuit region configured to include an active region defined by a device isolation film, such that the dummy gate exposes a center part and first and second ends of the active region;
  forming a bit line contact plug between the dummy gates in such a manner that the bit line contact plug is coupled to the center part of the active region; and
  forming a storage node contact plug that is spaced apart from the bit line contact plug by the dummy gate and is coupled to the first and second ends of the active region.

14. The method according to claim 13, the method further comprising forming a buried gate in the semiconductor substrate of the cell region.

15. The method according to claim 13, the method further comprising forming a bit line that is coupled to the bit line contact plug and that is parallel to the dummy gate.

16. The method according to claim 14, the method further comprising:
  forming a gate oxide film in the peripheral circuit region;
  forming a polysilicon layer over the gate oxide film;
  forming a barrier conductive layer over the polysilicon layer; and
  forming a gate metal layer over the barrier conductive layer.

17. The method according to claim 16, the method further comprising forming a hard mask layer over the semiconductor substrate of the cell region and over the gate metal layer of the peripheral circuit region.

18. The method according to claim 17, wherein the forming of the dummy gate includes:
  forming a mask pattern over the hard mask layer; and
  etching the hard mask layer of the cell region using the mask pattern as an etch mask such that the center part and the first and second ends of the active region are exposed.

19. The method according to claim 18, the method further comprising:
  forming an operation gate and the dummy gate simultaneously by etching the hard mask layer, the polysilicon layer, the barrier conductive layer, and the gate metal layer of the peripheral circuit region using the mask pattern as an etch mask.

20. The method according to claim 19, the method further comprising:
  forming a spacer insulation film at sidewalls of the semiconductor substrate of the cell region and the operation gate of the peripheral circuit region.

21. The method according to claim 20, the method further comprising:
  forming an interlayer insulation film over the cell region and the peripheral circuit region so as to be disposed between the dummy gate and the operation gate.

22. The method according to claim 21, wherein the forming of the bit line contact plug includes:
  forming a mask pattern defining a bit line contact hole over the interlayer insulation film;
  forming a bit line contact hole by etching the interlayer insulation film using the mask pattern as an etch mask so as to expose the center part of the active region; and
  forming a conductive layer over the bit line contact hole.

23. The method according to claim 22, wherein the forming of the bit line contact hole includes:
  etching the interlayer insulation film using an etch selection ratio between the interlayer insulation film and the dummy gate.

24. The method according to claim 21, wherein the forming of the storage node contact plug includes:
  forming a mask pattern defining a storage node contact hole over the interlayer insulation film;
  forming a storage node contact hole by etching the interlayer insulation film using the mask pattern as an etch mask to expose first and second ends of the active region; and
  forming a conductive layer over the storage node contact hole.

25. The method according to claim 24, wherein the forming of the storage node contact hole includes using a self-alignment scheme related to the dummy gate.

26. The method according to claim 22, the method further comprising forming a spacer in the bit line contact hole.

27. A method for forming a semiconductor device comprising:
  forming first and second active regions arranged along a first direction in a substrate;
  forming a dummy pattern extending from over the first active region to over the second active region along a second direction at an angle with respect to the first direction, wherein the dummy pattern divides the first active region into a first source region and a first drain region and further divides the second active region into a second source region and a second drain region;

forming an insulation layer over the substrate including the first and the second active regions;
forming a first mask pattern defining the first and the second drain regions over the insulation layer;
patterning the insulation layer using the first mask pattern and the dummy pattern;
forming a second mask pattern defining the first and the second source regions over the insulation layer; and
patterning the insulation layer using the second mask pattern and the dummy pattern.

* * * * *